United States Patent
Lee

(10) Patent No.: US 9,960,744 B1
(45) Date of Patent: May 1, 2018

(54) SPLIT-BAND COMPRESSION CIRCUIT, AUDIO SIGNAL PROCESSING METHOD AND AUDIO SIGNAL PROCESSING SYSTEM

(71) Applicant: AmTRAN Technology Co., Ltd., New Taipei (TW)

(72) Inventor: Mu-Hsuan Lee, New Taipei (TW)

(73) Assignee: AmTRAN Technology Co., Ltd., New Taipei (TW)

( * ) Notice: Subject to any disclaimer, the term of this patent is extended or adjusted under 35 U.S.C. 154(b) by 0 days. days.

(21) Appl. No.: 15/475,125

(22) Filed: Mar. 30, 2017

(30) Foreign Application Priority Data

Dec. 23, 2016 (TW) .............................. 105143026 A

(51) Int. Cl.
| H03G 5/00 | (2006.01) |
| G10L 19/26 | (2013.01) |
| G10L 19/008 | (2013.01) |
| H04H 60/04 | (2008.01) |

(52) U.S. Cl.
CPC .......... *H03G 5/005* (2013.01); *G10L 19/008* (2013.01); *G10L 19/26* (2013.01); *H04H 60/04* (2013.01)

(58) Field of Classification Search
CPC . G10L 19/008; G10L 21/038; G10L 21/0232; G10L 19/0208; G10L 19/26; H04R 3/002; H04R 3/04
See application file for complete search history.

(56) References Cited

U.S. PATENT DOCUMENTS

| 4,298,844 A * | 11/1981 | Shimp ...................... H03F 3/68 330/124 D |
| 5,436,940 A * | 7/1995 | Nguyen .................. H04B 1/667 375/240 |
| 6,124,895 A * | 9/2000 | Fielder ............. G11B 20/10527 348/515 |
| 9,432,042 B2 * | 8/2016 | Knierim ................ H03M 1/121 |
| 9,454,974 B2 * | 9/2016 | Krishnan ............... G10L 21/038 |
| 2006/0277039 A1 * | 12/2006 | Vos ...................... G10L 19/0208 704/219 |
| 2008/0027711 A1 * | 1/2008 | Rajendran ............. G10L 19/167 704/201 |
| 2014/0321666 A1 * | 10/2014 | Bithell ...................... H04R 3/04 381/94.1 |
| 2015/0003633 A1 * | 1/2015 | Trammell ............. G10L 21/003 381/99 |

* cited by examiner

*Primary Examiner* — Mohammad Islam
(74) *Attorney, Agent, or Firm* — CKC & Partners Co., Ltd.

(57) ABSTRACT

A split-band compression circuit includes first stage filters, split-band limiters, and second stage filters. The first stage filters are configured to receive and filter an input signal to output first split-band signals. The split-band limiters are coupled to the first stage filters respectively, and configured to perform compression on the first split-band signals to output second split-band signals. The second stage filters are coupled to the split-band limiters respectively, and configured to filter corresponding second split-band signals to output output signals. The first stage filter and the second stage filter corresponding to the same split-band limiter have different cut-off frequencies respectively.

10 Claims, 6 Drawing Sheets

SPLIT-BAND COMPRESSION CIRCUIT, AUDIO SIGNAL PROCESSING METHOD AND AUDIO SIGNAL PROCESSING SYSTEM

RELATED APPLICATIONS

This application claims priority to Taiwan Application Serial Number 105143026 filed Dec. 23, 2016, which is herein incorporated by reference.

BACKGROUND

Technical Field

The present disclosure relates to a split-band compression circuit, and in particular, to a split-band compression circuit in an audio signal processing system.

Description of Related Art

In existing conventional technology, in order to protect a speaker and maintain low distortion rate of an output of an amplifier, an all-channel dynamic range compressor or limiter is added to the audio signal processing to perform dynamic range limitation/compression on signals within the whole audio frequency range simultaneously.

However, performing dynamic range limitation/compression on the signals within the whole audio frequency range may cause a portion of the signals which do not reach the requirement of limitation/compression level are also limited along with the large signals being limited, thus resulting in the sound pressure level (SPL) loss. For a sound system with bass enhancement, treble enhancement, or 3D surrounding enhancement, the sound pressure level loss is even apparent.

Therefore, it is an important research topic in the field to design a split-band compression circuit in the audio signal processing system.

SUMMARY

One aspect of the present disclosure is to provide a split-band compression circuit. The split-band compression circuit includes first stage filters, split-band limiters and second stage filters. The first stage filters are configured to receive an input signal and filter the input signal respectively to output first split-band signals. The split-band limiters are electrically coupled to the first stage filters respectively, and configured to perform compression to the first split-band signals to output second split-band signals. The second stage filters are electrically coupled to the split-band limiters respectively, and configured to filter corresponding second split-band signals to output output signals. The first stage filter and the second stage filter corresponding to the same split-band limiter have different cut-off frequencies.

Another aspect of the present disclosure is an audio signal processing method. The audio signal processing method includes: filtering, by first stage filters, an input signal according to first stage cut-off frequencies to divide the input signal to first split-band signals corresponding to different frequency bands; performing compression, by split-band limiters, to the first split-band signals respectively, to output compressed second split-band signals; and filtering, by second stage filters, the second split-band signals according to second stage cut-off frequencies different from the first stage cut-off frequencies respectively, to output output signals.

Yet another aspect of the present disclosure is to provide an audio signal processing system. The audio signal processing system includes a signal input terminal, a processor, a power amplifier and a speaker. The signal input terminal is configured to receive an input signal. The processor is electrically coupled to the signal input terminal and configured to execute an audio signal processing method to output a mixed signal. The power amplifier is electrically coupled to the processor and configured to amplify the mixed signal and output an amplified mixed signal. The speaker is electrically coupled to the power amplifier and configured to receive the amplified mixed signal and output an audio signal. The audio signal processing method executed by the processor includes: filtering, by first stage filters, an input signal according to first stage cut-off frequencies to divide the input signal to first split-band signals corresponding to different frequency bands; performing compression, by split-band limiters, to the first split-band signals respectively, to output compressed second split-band signals; filtering, by second stage filters, the second split-band signals according to second stage cut-off frequencies different from the first stage cut-off frequencies respectively, to output output signals; and receiving and mixing, by a mixer unit, the output signals in order to output the mixed signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
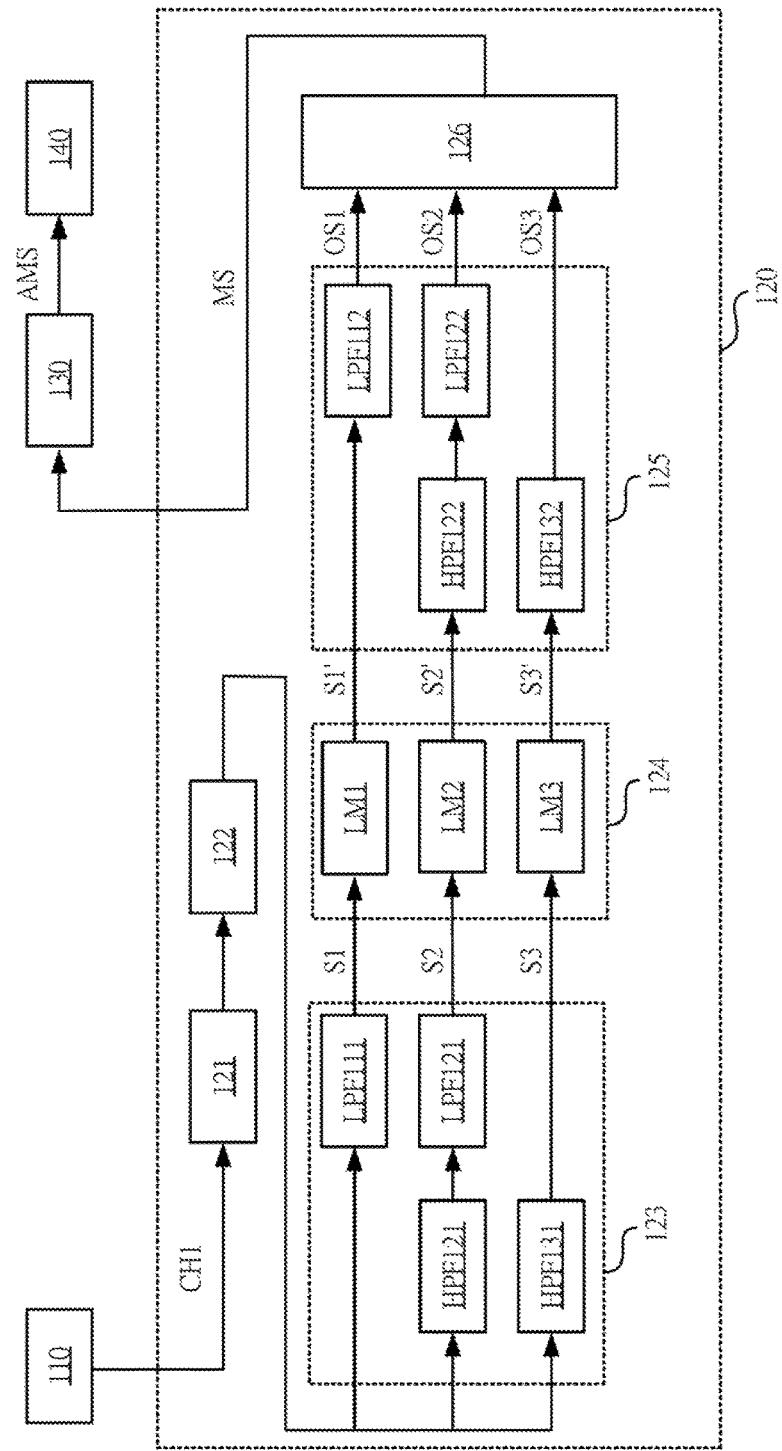
FIG. 1 is a schematic diagram illustrating an audio signal processing system according to some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Reference is made to FIG. 1. FIG. 1 is a schematic diagram illustrating an audio signal processing system 100 according to some embodiments of the present disclosure. As shown in FIG. 1, in some embodiments, the audio signal processing system 100 includes a signal input terminal 110, a split-band compression circuit 120, a power amplifier 130 and a speaker 140. Specifically, the signal input terminal 100 is configured to receive an input signal CH1, and output the input signal CH1 to the split-band compression circuit 120.

In some embodiments, the split-band compression circuit 120 includes a post-processing unit 121, a high-pass filtering unit 122, a first stage filtering unit 123, a split-band limiting unit 124, a second stage filtering unit 125, and a mixing unit 126, in which the detailed operation of the aforementioned components will be discussed in the following paragraphs in accompanying with the drawings.

In some embodiments, the power amplifier 130 is electrically coupled to the split-band compression circuit 120 and configured to amplify a mixed signal MS and output an amplified mixed signal AMS. The speaker 140 is electrically coupled to the power amplifier 130 and configured to receive the amplified mixed signal AMS and output an audio signal.

The post-processing unit 121, the high-pass filtering unit 122, the first stage filtering unit 123, the split-band limiting unit 124, the second stage filtering unit 125, and the mixing unit 126 of the split-band compression circuit 120 may be implemented by hardware, software, and/or firmware. For example, if the execution speed and accuracy are paramount consideration, the aforementioned units may be implemented in hardware-based and/or firmware-based solutions substantially. If the flexibilities of the design are paramount consideration, the aforementioned units may be implemented in software-based solutions substantially. Alternatively, these units can simultaneously use the software, hardware and firmware collaboration. It is noted that, in these examples cited above, there is no differentiation between a good or a bad implementation and also no intention to limit the disclosure. Those of ordinary skill in the art may flexibly choose the specific implementation of these units based on actual needs.

For example, in some embodiments, the split-band compression circuit 120 may be achieved by various processors, such as a Digital Signal Processor (DSP). Alternatively stated, the post-processing unit 121, the high-pass filtering unit 122, the first stage filtering unit 123, the split-band limiting unit 124, the second stage filtering unit 125, and the mixing unit 126 may be integrated in the processor electrically coupled to the signal input terminal 110 and the power amplifier 130, and an audio signal processing method may be executed by the units stated above so as to output the mixed signal MS.

In addition, in some other embodiments, the audio signal processing method executed by processor may also be implemented in a computer program and stored in a storage device. The storage device may include a non-transitory computer-readable medium or other devices having a storage function. The computer program includes multiple instructions, which may be executed by a central processing unit in order to perform the function of each unit.

As depicted in FIG. 1, in some embodiments, the required signal processing may be performed on the input signal CH1 by the post-processing unit 121, and then the non-necessary low-band signal may be filtered out by the high-pass filtering unit 122. Accordingly, the input signal CH1 undergoing the aforementioned processing may be provided to the first stage filtering unit 123, the split-band limiting unit 124, and the second stage filtering unit 125, thereby performing multi-channel split-band dynamic compression.

Specifically, the first stage filtering unit 123 of the split-band compression circuit 120 includes multiple first stage filters. For example, in the present embodiment, the first stage filtering unit 123 includes a first stage low pass filter LPF111, a first stage band pass filter implemented by a low pass filter LPF121 and a high pass filter HPF121, and a first stage high pass filter HPF131. The aforementioned first stage filters are configured to receive the input signal CH1 and filter the input signal CH1 to output multiple first split-band signals S1, S2, and S3. The first split-band signals S1, S2, and S3 correspond to different frequency band of the input signal CH1 respectively. For example, the first split-band signal S1, which is outputted by the first stage low pass filter LPF111 after the input signal CH1 is filtered, corresponds to the low band portion of the input signal CH1. The first split-band signal S2, which is outputted by the first stage band pass filter implemented by the low pass filter LPF121 and the high pass filter HPF121 after the input signal CH1 is filtered, corresponds to the mid band portion of the input signal CH1. The first split-band signal S3, which is outputted by the first stage high pass filter HPF131 after the input signal CH1 is filtered, corresponds to the high band portion of the input signal CH1.

Accordingly, the split-band limiting unit 124 may receive the first split-band signals S1, S2 and S3, and perform dynamic range limitation and compression on the signals with different frequency bands respectively. Specifically, the split-band limiting unit 124 includes split-band limiters LM1, LM2 and LM3. The split-band limiters LM1, LM2 and LM3 are electrically coupled to the first stage filters in the first stage filtering unit 123 respectively, and configured to perform compression on the first split-band signals S1, S2 and S3 respectively to output corresponding second split-band signals S1', S2' and S3'.

The second split-band signals S1', S2' and S3' after compression may be once again filtered by the second stage filtering unit 125 so as to obtain output signals OS1, OS2 and OS3. Thus, the mixing unit 126 may receive the output signals OS1, OS2 and OS3 and perform mixing on the output signals OS1, OS2 and OS3 so as to output the mixed signal MS.

Specifically, the second stage filtering unit 125 includes multiple second stage filters, and each of the second stage filters corresponds to a corresponding one of the split-band limiters LM1, LM2 and LM3, and a corresponding one of the first stage filters. The second stage filters are electrically coupled to the split-band limiters LM1, LM2 and LM3 respectively, and configured to filter the corresponding second split-band signals S1', S2' and S3' to output the corresponding output signals OS1, OS2 and OS3. In some embodiments, the split-band limiter LM1 is a low band limiter, the split-band limiter LM2 is a mid-band limiter, and the split-band limiter LM3 is a high band limiter.

Figure 2:
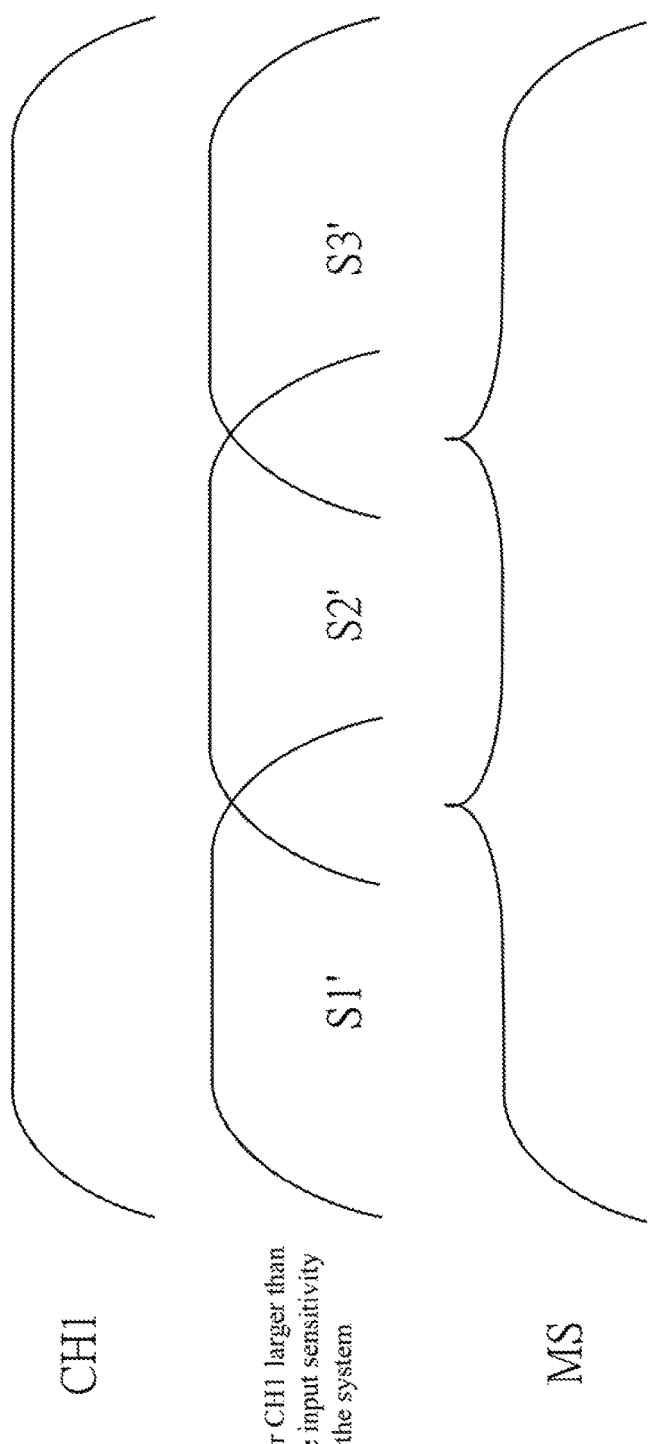
FIG. 2-FIG. 4 are schematic diagrams illustrating dynamic range limitation and compression according to some embodiments of the present disclosure.
Figure 3:
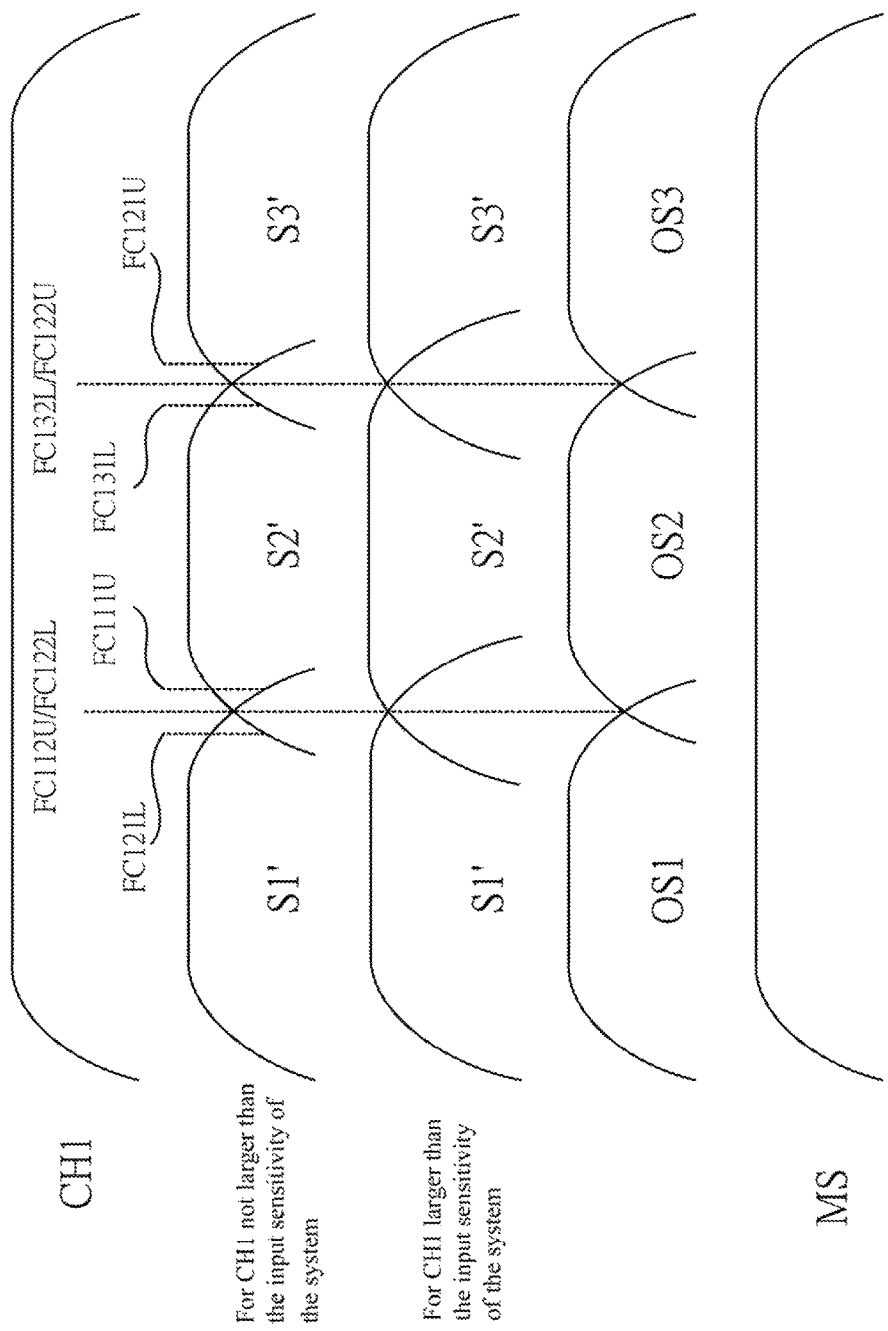

Reference is made to FIG. 2 and FIG. 3 together. FIG. 2 and FIG. 3 are schematic diagrams illustrating dynamic range limitation and compression according to some embodiments of the present disclosure. In the embodiment shown in FIG. 2, the second split-band signals S1', S2' and S3' are not filtered again, and are directly mixed by the mixing unit 126. As shown in the figures, when the amplitude of the input signal CH1 is larger than the input sensitivity of the system, the second split-band signals S1', S2' and S3' outputted after the frequency division and dynamic range limitation/compression are performed to the input signal CH1, has a frequency response value greater than −3 dB at around the frequency division point. Thus, after the second split-band signals S1', S2' and S3' are mixed and the mixed signal MS is outputted, the signal at around the frequency division point are additionally amplified after superimposition, thus causing the signal distortion.

Compared to the distorted waveform of the mixed signal MS shown in FIG. 2, in the embodiment shown in FIG. 3, the second split-band signals S1', S2' and S3' are filtered again by the second stage filtering unit 125 to provide and mix the output signals OS1, OS2 and OS3, so as to output the mixed signal MS. Therefore, no matter whether the input signal CH1 is larger than the input sensitivity of the system, no signal distortion occurs in the mixed signal MS. Even if the input signal CH1 is too large and the frequency response value for the second split-band signals S1', S2' and S3' at around the frequency division point is larger than −3 dB, the second stage filtering unit 125 may still be configured to provide proper cut-off frequencies for the second split-band signals S1', S2' and S3' respectively, such that the frequency response value for the output signals OS1, OS2 and OS3 at around the frequency division point is about −3 dB. Thus, when the output signals OS1, OS2 and OS3 are mixed to output the mixed signal MS by the mixing unit 126, the signals at around the frequency division point are not distorted after superimposition.

Alternatively stated, by arranging the second stage filtering unit 125 at the output side of the split-band limiters LM1, LM2 and LM3 to filter the compressed second split-band signals S1', S2' and S3' again, the distortion of the signal waveform due to the large input signal CH1 may be prevented.

Figure 4:
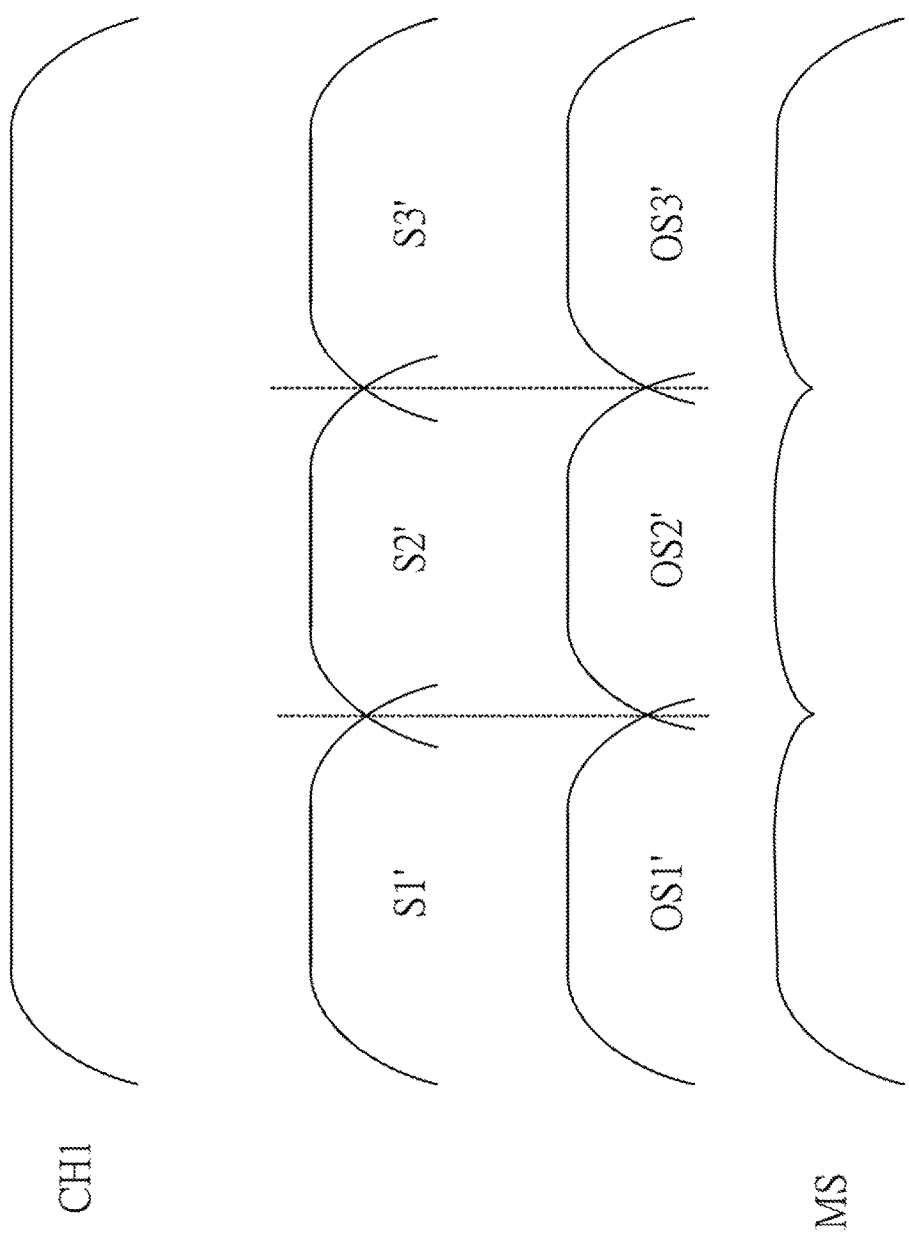

Reference is made to FIG. 4. FIG. 4 is a schematic diagram illustrating dynamic range limitation and compression according to some embodiments of the present disclosure. In the embodiment shown in FIG. 4, although the second split-band signals S1', S2' and S3' are filtered to output the corresponding output signals OS1, OS2 and OS3 by the second stage filtering unit 125, since the same cut-off frequency is set on the corresponding filters of the first stage filtering unit 123 and the second stage filtering unit 125, the frequency response value for the output signals OS1, OS2 and OS3 at around the frequency division point is lower than −3 dB due to the fact that the signals at around the frequency division point experience repeated signal loss according to the same cut-off frequency. Accordingly, when the output signals OS1, OS2 and OS3 are mixed to output the mixed signal MS by the mixing unit 126, the signals at around the frequency division point are distorted because of too small signal caused by insufficient composition, thus resulting in an uneven frequency response.

Reference is once again made to FIG. 1 and FIG. 3. As shown in FIG. 1 and FIG. 3, in some embodiments of the present disclosure, different cut-off frequencies are set on the corresponding filters of the first stage filtering unit 123 and the second stage filtering unit 125. For example, in the present embodiment, the first stage low pass filter LPF111 and the second stage low pass filter LPF112 correspond to the low-band limiter LM1, and the upper cut-off frequency FC111U of the first stage low pass filter LPF111 is higher than the upper cut-off frequency FC112U of the corresponding second stage low pass filter LPF112. In some embodiments, the upper cut-off frequency FC111U is at least twice of the upper cut-off frequency FC112U.

Similarly, the first stage high pass filter HPF131 and the second stage high pass filter HPF132 correspond to the high-band limiter LM3. The lower cut-off frequency FC131L of the first stage high pass filter HPF131 is lower than the lower cut-off frequency FC132L of the second stage high pass filter HPF132. In some embodiments, the lower cut-off frequency FC132L is at least twice of the lower cut-off frequency FC131L.

Similarly, the first stage band pass filter and the second stage band pass filter correspond to the mid-band limiter LM2. The lower cut-off frequency FC121L of the first stage band pass filter is lower than the lower cut-off frequency FC122L of the second stage band pass filter. The upper cut-off frequency FC121U of the first stage band pass filter is higher than the upper cut-off frequency FC122U of the second stage band pass filter. In some embodiments, the lower cut-off frequency FC122L is at least twice of the lower cut-off frequency FC121L, and the upper cut-off frequency FC121U is at least twice of the upper cut-off frequency FC122U.

In addition, as shown in FIG. 3, in some embodiments, the lower cut-off frequency FC122L of the second stage band pass filter may be configured to be the same as the upper cut-off frequency FC112U of the second stage low pass filter LPF112. For example, in some embodiments, the lower cut-off frequency FC122L and the upper cut-off frequency FC112U may be configured to be about 250 Hz.

Similarly, the upper cut-off frequency FC122U of the second stage band pass filter may be configured to be the same as the lower cut-off frequency FC132L of the second stage high pass filter HPF132. For example, in some embodiments, the upper cut-off frequency FC122U and the lower cut-off frequency FC132L may be configured to be about 3 KHz.

Accordingly, since the bandwidth of the first stage filtering unit 123 is broader than the bandwidth of the second stage filtering unit 125, it is can be ensured that when the second stage filtering unit 125 performs filtering on the second split-band signals S1', S2' and S3', no signal loss will be repeated to cause the frequency response value for the output signals OS1, OS2 and OS3 to be lower than −3 dB. Thus, by setting different first stage cut-off frequencies and second stage cut-off frequencies on the first stage filters and the second stage filters to perform filtering, the split-band compression circuit 120 may ensure that the frequency response value for the output signals OS1, OS2 and OS3 around the frequency division point is about −3 dB when the input signal CH1 is not larger than the input sensitivity of the system. When the output signals OS1, OS2 and OS3 are mixed to output the mixed signal MS by the mixing unit 126, the signals at around the frequency division point are not distorted, and no uneven frequency response occurs.

Thereafter, the mixed signal MS may be transmitted to the power amplifier 130 and the speaker 140 to achieve the output of the audio signal, in which detailed operations are discussed in the above paragraphs and thus are not described again herein for the sake of brevity.

Figure 5:
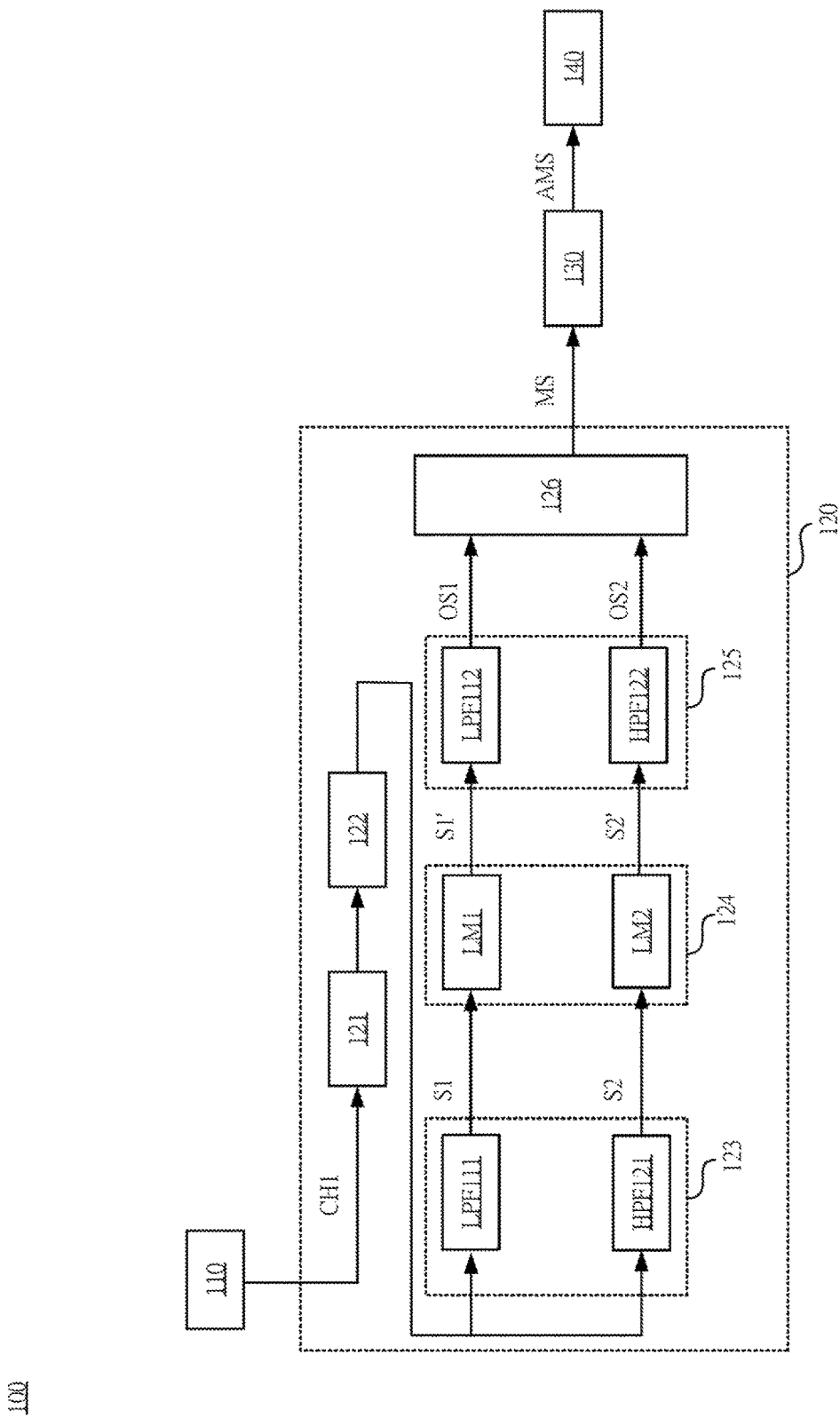
FIG. 5 is a schematic diagram illustrating an audio signal processing system according to other embodiments of the present disclosure.

It is noted that the audio signal processing system 100 and the split-band compression circuit 120 are merely described as an example, and do not intend to limit the present disclosure. For example, reference is made to FIG. 5. FIG. 5 is a schematic diagram illustrating the audio signal processing system 100 according to other embodiments of the present disclosure. With respect to the embodiments of FIG. 1, like elements in FIG. 5 are designated with the same reference numbers for ease of understanding. The specific operations of similar elements, which are already discussed in detail in the above paragraphs, are not explained again herein for the sake of brevity. As depicted in FIG. 5, in some embodiments, the split-band compression circuit 120 may have only two split-band limiters used to divide the input signal into a low-band and a high-band, so as to perform dynamic range limitation and compression respectively. In addition, in other embodiments, the split-band compression circuit 120 may also have four or more split-band limiters used to divide the input signal into more frequency bands, so as to perform dynamic range limitation and compression respectively. Those skilled in the art can directly understand how to adjust the numbers and configuration of the filters in the first stage filtering unit 123 and the second stage filtering unit 125 to achieve the corresponding operations and thus further explanation are omitted herein for the sake of brevity.

Furthermore, although only the input signal CH1 of one input channel is illustrated in the drawings, for the multiple input channels having input signals CH1-CHn, the split-band compression circuit 120 may also perform the frequency division and dynamic range limitation and compression to each of the input signals CH1-CHn respectively. The embodiments shown in the drawings are merely simplified examples for the ease of discussion, and do not intend to limit the present disclosure.

Figure 6:
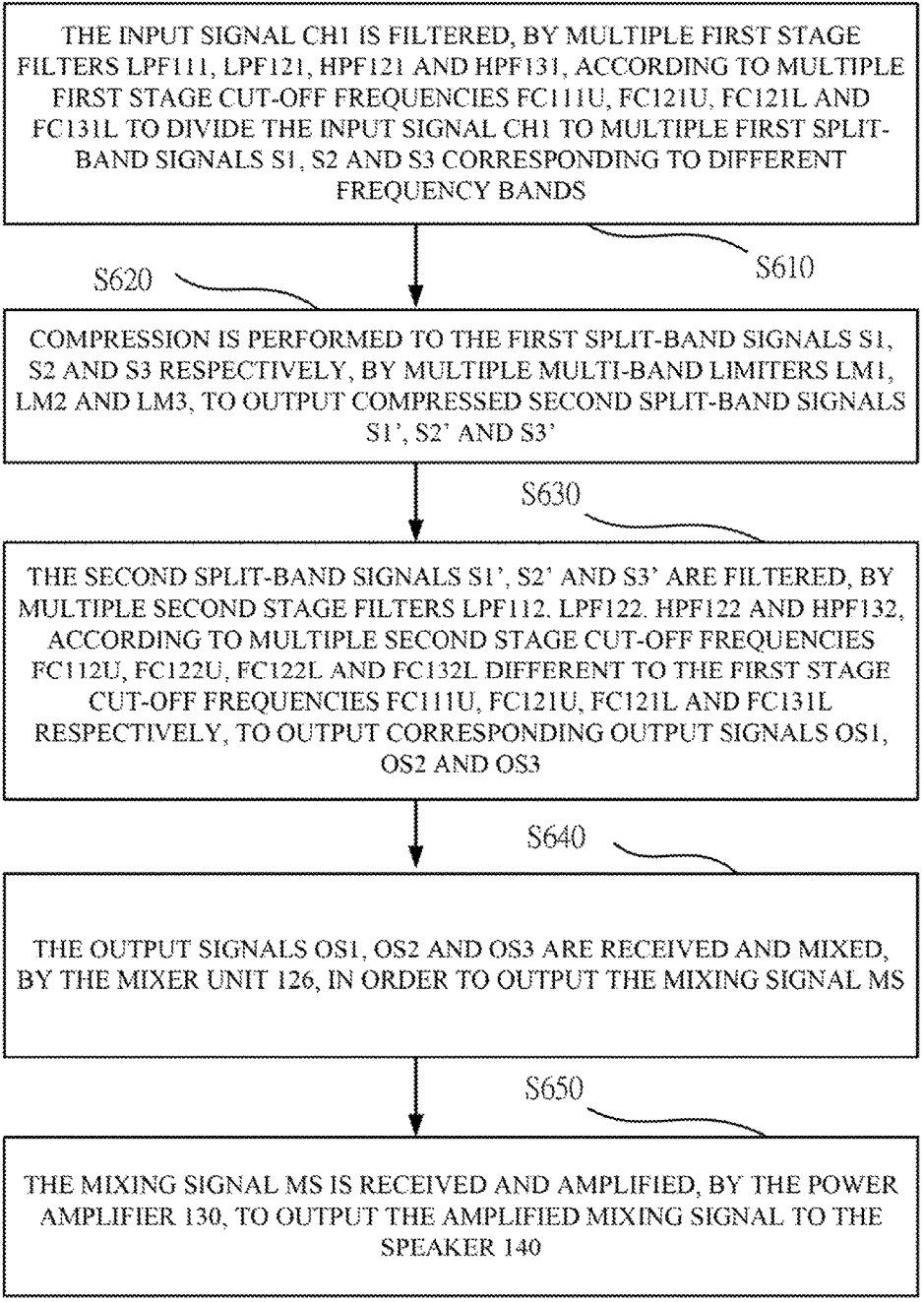
FIG. 6 is a schematic diagram illustrating an audio signal processing method according to some embodiments of the present disclosure.

Reference is made to FIG. 6. FIG. 6 is a schematic diagram illustrating an audio signal processing method 600 according to some embodiments of the present disclosure. For better understanding of the present disclosure, the audio signal processing method 600 is discussed in relation to the audio signal processing system 100 shown in FIG. 1 or FIG. 5, but is not limited thereto. Those skilled in the art may make various modifications and variations without departing from the scope or spirit of the disclosure. As depicted in FIG. 6, the audio signal processing method 600 includes steps S610, S620, S630, S640, and S650.

First, at step S610, the input signal CH1 is filtered by multiple first stage filters LPF111, LPF121, HPF121 and HPF131, according to multiple first stage cut-off frequencies FC111U, FC121U, FC121L and FC131L, so as to divide the input signal CH1 into multiple first split-band signals S1, S2 and S3 corresponding to different frequency bands.

Next, at step S620, compression is performed on the first split-band signals S1, S2 and S3 respectively by multiple split-band limiters LM1, LM2 and LM3, so as to output compressed second split-band signals S1', S2' and S3'.

Next, at step S630, the second split-band signals S1', S2' and S3' are filtered by multiple second stage filters LPF112, LPF122, HPF122 and HPF132, according to multiple second stage cut-off frequencies FC112U, FC122U, FC122L and FC132L different from the first stage cut-off frequencies FC111U, FC121U, FC121L and FC131L respectively, so as to output corresponding output signals OS1, OS2 and OS3.

Next, at step S640, the output signals OS1, OS2 and OS3 are received and mixed by the mixer unit 126, so as to output the mixed signal MS.

Thereafter, at step S650, the mixed signal MS is received and amplified by the power amplifier 130, so as to output the amplified mixed signal to the speaker 140.

As stated in the above paragraphs, in some embodiments, the upper cut-off frequency (e.g., cut-off frequencies FC111U, FC121U) of any one of the first stage cut-off frequencies is higher than the upper cut-off frequency (e.g., cut-off frequencies FC112U, FC122U) of the corresponding second stage cut-off frequency. Similarly, the lower cut-off frequency (e.g., cut-off frequencies FC121L, FC131L) of any one of the first stage cut-off frequencies is lower than the lower cut-off frequency (e.g., cut-off frequencies FC122L, FC132L) of the corresponding second stage cut-off frequency.

While disclosed methods are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Those skilled in the art can immediately understand how to perform the operations and functions of the audio signal processing method 600 based on the audio signal processing system 100 and the split-band compression circuit 120 in the various embodiments described above, and thus a further explanation is omitted herein for the sake of brevity.

In sum, in various embodiments of the present disclosure, by performing filtering before and after the split-band limiters LM1, LM2 and LM3 respectively and configuring different first stage cut-off frequencies and second stage cut-off frequencies, it is guaranteed that for different input signal CH1, the split-band compression circuit 120 may perform dynamic range limitation and compression successfully, such that no distortion occurs in the waveform of the outputted mixed signal MS, and the frequency response is kept even.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A split-band compression circuit, comprising:
   a plurality of first stage filters configured to receive and filter an input signal so as to output a plurality of first split-band signals;
   a plurality of split-band limiters electrically coupled to the first stage filters respectively, and configured to perform compression on the first split-band signals so as to output a plurality of second split-band signals; and
   a plurality of second stage filters electrically coupled to the split-band limiters respectively, and configured to filter corresponding second split-band signals so as to output a plurality of output signals;
   wherein the first stage filter and the second stage filter corresponding to the same split-band limiter have different cut-off frequencies.

2. The split-band compression circuit of claim 1, wherein a first stage low pass filter in the first stage filters and a second stage low pass filter in the second stage filters correspond to a low-band limiter in the split-band limiters, and the upper cut-off frequency of the first stage low pass filter is higher than the upper cut-off frequency of the second stage low pass filter.

3. The split-band compression circuit of claim 1, wherein a first stage high pass filter of the first stage filters and a second stage high pass filter of the second stage filters correspond to a high-band limiter of the split-band limiters, and a lower cut-off frequency of the first stage high pass filter is lower than a lower cut-off frequency of the second stage high pass filter.

4. The split-band compression circuit of claim 1, wherein a first stage band pass filter of the first stage filters and a second stage band pass filter of the second stage filters correspond to a mid-band limiter of the split-band limiters, and a lower cut-off frequency of the first stage band pass filter is lower than a lower cut-off frequency of the second stage band pass filter, and an upper cut-off frequency of the first stage band pass filter is higher than an upper cut-off frequency of the second stage band pass filter.

5. The split-band compression circuit of claim 1, further comprising:
a mixer unit configured to receive the output signals and perform mixing on the output signals so as to output a mixed signal.

6. An audio signal processing method, comprising:
filtering, by a plurality of first stage filters, an input signal according to a plurality of first stage cut-off frequencies, so as to divide the input signal into a plurality of first split-band signals corresponding to different frequency bands;
performing compression, by a plurality of split-band limiters, on the first split-band signals respectively, so as to output a plurality of compressed second split-band signals; and
filtering, by a plurality of second stage filters, the second split-band signals respectively according to a plurality of second stage cut-off frequencies that are different from the first stage cut-off frequencies, so as to output a plurality of output signals.

7. The audio signal processing method of claim 6, wherein an upper cut-off frequency of any one of the first stage cut-off frequencies is higher than an upper cut-off frequency of the corresponding second stage cut-off frequency, and a lower cut-off frequency of any one of the first stage cut-off frequencies is lower than a lower cut-off frequency of the corresponding second stage cut-off frequency.

8. The audio signal processing method of claim 6, further comprising:
receiving and mixing, by a mixer unit, the output signals, so as to output a mixed signal; and
receiving and amplifying, by a power amplifier, the mixed signal, so as to output an amplified mixed signal to a speaker.

9. An audio signal processing system, comprising:
a signal input terminal configured to receive an input signal;
a processor electrically coupled to the signal input terminal and configured to execute an audio signal processing method to output a mixed signal;
a power amplifier electrically coupled to the processor and configured to amplify the mixed signal and output an amplified mixed signal; and
a speaker electrically coupled to the power amplifier and configured to receive the amplified mixed signal and output an audio signal;
wherein the audio signal processing method executed by the processor comprises:
filtering, by a plurality of first stage filters, an input signal according to a plurality of first stage cut-off frequencies, so as to divide the input signal into a plurality of first split-band signals corresponding to different frequency bands;
performing compression, by a plurality of split-band limiters, on the first split-band signals respectively, so as to output a plurality of compressed second split-band signals;
filtering, by a plurality of second stage filters, the second split-band signals according to a plurality of second stage cut-off frequencies that are different from the first stage cut-off frequencies respectively, so as to output a plurality of output signals; and
receiving and mixing, by a mixer unit, the output signals, so as to output the mixed signal.

10. The audio signal processing system of claim 9, wherein an upper cut-off frequency of any one of the first stage cut-off frequencies is higher than an upper cut-off frequency of the corresponding second stage cut-off frequency, and a lower cut-off frequency of any one of the first stage cut-off frequencies is lower than a lower cut-off frequency of the corresponding second stage cut-off frequency.

\* \* \* \* \*